United States Patent
Yoo et al.

(10) Patent No.: US 10,998,185 B2
(45) Date of Patent: May 4, 2021

(54) SUBSTRATE CLEANING METHOD, SUBSTRATE CLEANING APPARATUS, AND METHOD FOR FABRICATING A SEMICONDUCTOR DEVICE USING THE APPARATUS

(71) Applicant: SAMSUNG ELECTRONICS CO., LTD., Suwon-si (KR)

(72) Inventors: Beomjin Yoo, Hwaseong-si (KR); Minhyoung Kim, Seoul (KR); Wonhyuk Jang, Seoul (KR); Hoseop Choi, Hwaseong-si (KR); Jeongmin Bang, Seoul (KR); KyuHee Han, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/294,453

(22) Filed: Mar. 6, 2019

(65) Prior Publication Data
US 2019/0295843 A1    Sep. 26, 2019

(30) Foreign Application Priority Data
Mar. 21, 2018    (KR) .......................... 10-2018-0032418

(51) Int. Cl.
*H01L 21/02* (2006.01)
*H01L 21/67* (2006.01)
*H01L 21/268* (2006.01)

(52) U.S. Cl.
CPC ...... *H01L 21/02101* (2013.01); *H01L 21/268* (2013.01); *H01L 21/67034* (2013.01); *H01L 21/67051* (2013.01); *H01L 21/67115* (2013.01)

(58) Field of Classification Search
CPC ............ H01L 21/677; H01L 21/67703; H01L 21/67715; H01L 21/67733; H01L 21/67736; H01L 21/67739; H01L 21/67745; H01L 21/67748; H01L 21/67763–67778; H01L 21/6779; H01L 21/02101; H01L 21/02098; H01L 21/02345; H01L 21/02354; H01L 21/423; H01L 21/428; H01L 21/263; H01L 21/268; H01L 21/67115; H01L 21/67098;
(Continued)

(56) References Cited

U.S. PATENT DOCUMENTS 7,068,926 B2   6/2006   Nozaki
7,913,702 B2   3/2011   Moriya
(Continued)

FOREIGN PATENT DOCUMENTS

JP    2004-186530 A    7/2004
JP    2007-019158 A    1/2007
(Continued)

*Primary Examiner* — Mikhail Kornakov
*Assistant Examiner* — Richard Z. Zhang
(74) *Attorney, Agent, or Firm* — Sughrue Mion, PLLC

(57) ABSTRACT

Disclosed are a method for cleaning a substrate, an apparatus for cleaning a substrate, and a method for fabricating a semiconductor device using the same. The method may include cleaning a substrate in a wet process, providing a supercritical fluid onto the substrate to remove moisture from the substrate, and cleaning the substrate in a dry process to remove defect particles from a substrate, which are produced by the supercritical fluid.

13 Claims, 12 Drawing Sheets

(58) Field of Classification Search
CPC ......... H01L 21/67103; H01L 21/67034; H01L 21/67028; H01L 21/67017; H01L 21/02057; B08B 7/0042; B08B 7/0035; B08B 7/005; B08B 7/0057; F26B 3/28
See application file for complete search history.

(56) References Cited

U.S. PATENT DOCUMENTS

| | | |
|---|---|---|
| 8,173,934 B2 | 5/2012 | Lee et al. |
| 8,377,711 B2 | 2/2013 | Henry et al. |
| 8,987,123 B2 | 3/2015 | Yamada et al. |
| 9,004,086 B2 | 4/2015 | Nixon et al. |
| 9,570,286 B2 | 2/2017 | Sato et al. |
| 9,583,330 B2 | 2/2017 | Ji et al. |
| 10,197,333 B2 | 2/2019 | Kim et al. |
| 2008/0017114 A1 | 1/2008 | Watanabe et al. |
| 2009/0008372 A1 | 1/2009 | Lee et al. |
| 2009/0311850 A1* | 12/2009 | Sanchez ................ H01L 21/268 438/473 |
| 2010/0071732 A1 | 3/2010 | Moriya |
| 2010/0075504 A1* | 3/2010 | Tomita .............. H01L 21/02071 438/706 |
| 2010/0236579 A1* | 9/2010 | Araki ................ H01L 21/67051 134/26 |
| 2011/0237080 A1* | 9/2011 | Liu ....................... B08B 7/0042 438/694 |
| 2014/0144462 A1* | 5/2014 | Verhaverbeke ....... B08B 7/0021 134/1.2 |

FOREIGN PATENT DOCUMENTS

| | | |
|---|---|---|
| JP | 2007-187766 A | 7/2007 |
| JP | 2008-128567 A | 6/2008 |
| KR | 10-0841346 B1 | 6/2008 |

* cited by examiner

«SUBSTRATE CLEANING METHOD, SUBSTRATE CLEANING APPARATUS, AND METHOD FOR FABRICATING A SEMICONDUCTOR DEVICE USING THE APPARATUS

CROSS-REFERENCE TO THE RELATED APPLICATION

This U.S. non-provisional patent application claims priority under 35 U.S.C. § 119 to Korean Patent Application No. 10-2018-0032418, filed on Mar. 21, 2018, in the Korean Intellectual Property Office, the entire contents of which are hereby incorporated by reference.

FIELD

The present disclosure relates to a method for fabricating a semiconductor device, and in particular, to a method for cleaning a substrate in a wet process, a substrate cleaning apparatus, and a method for fabricating a semiconductor device using the same.

BACKGROUND

In general, a semiconductor device is fabricated by a plurality of unit processes. The unit processes include a deposition process, a lithography process, an etching process, and a cleaning process. The cleaning process is performed to remove a contamination material (e.g., particles) from a surface of a substrate. The cleaning process is classified into a wet cleaning process and a dry cleaning process. In the wet cleaning process, for example, a chemical solution is used to remove particles from the substrate. In the dry cleaning process, for example, plasma is used to clean the substrate.

SUMMARY

Some embodiments of the inventive concept provide a substrate cleaning method of removing defect particles produced by supercritical fluid, a substrate cleaning apparatus, and a method for fabricating a semiconductor device using the substrate cleaning apparatus.

According to some embodiments of the inventive concept, a method for cleaning a substrate may include cleaning the substrate in a wet process, providing a supercritical fluid onto the substrate to remove moisture from the substrate, and cleaning the substrate in a dry process to remove defect particles, produced by the supercritical fluid, from the substrate.

According to some embodiments of the inventive concept, a method for fabricating a semiconductor device may include etching a substrate to form trenches, cleaning the substrate in a wet process to remove first particles produced in the trenches, providing a supercritical fluid onto the substrate to remove moisture from the substrate, and cleaning the substrate in a dry process to remove second particles produced on a top surface of the substrate by the supercritical fluid.

According to some embodiments of the inventive concept, an apparatus for cleaning a substrate may include an index module configured to load or unload a substrate in or from a carrier, a cleaning module configured to perform a cleaning process on the substrate, a dehumidification module configured to dry the substrate using a supercritical fluid, and a transfer module disposed near the dehumidification module, the cleaning module, and the index module, wherein the transfer module is configured to transfer the substrate from one of the index module, the cleaning module, and the dehumidification module to the other, wherein the transfer module includes a transfer unit disposed between the cleaning module and the index module and is configured to transfer the substrate from one of the cleaning module and the dehumidification module to the other, and a buffer unit disposed between the transfer unit and the index module, wherein the buffer unit includes an annealing portion configured to heat the substrate and to remove defect particles produced on the substrate by the supercritical fluid.

DETAILED DESCRIPTION

Figure 1:
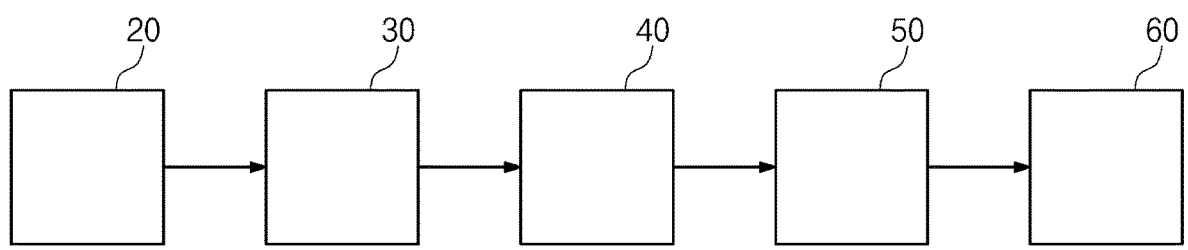
FIG. 1 is a diagram schematically illustrating a fabrication system, which may be used to fabricate a semiconductor device, according to some embodiments of the inventive concept.

FIG. 1 is a diagram schematically illustrating a fabrication system 10, which may be used to fabricate a semiconductor device, according to some embodiments of the inventive concept.

Referring to FIG. 1, the fabrication system 10 may include a plurality of apparatuses, which are configured to perform a plurality of unit processes, and may be used to form a device isolation layer or a shallow trench insulation (STI) structure. In some embodiments, the fabrication system 10 may include a photolithography apparatus 20, an etching apparatus 30, a cleaning apparatus 40, a deposition apparatus 50, and a polishing apparatus 60. The photolithography apparatus 20 may be configured to form a photoresist pattern on a substrate. The etching apparatus 30 may be provided between the photolithography apparatus 20 and the cleaning apparatus 40. The etching apparatus 30 may be configured to etch a portion of the substrate, which is exposed by the photoresist pattern, and to form a trench in the substrate. The cleaning apparatus 40 may be provided between the etching apparatus 30 and the deposition apparatus 50. The cleaning apparatus 40 may be configured to clean the substrate. The deposition apparatus 50 may be provided between the cleaning apparatus 40 and the polishing apparatus 60. The deposition apparatus 50 may be configured to form a thin layer (e.g., a preliminary device isolation layer) on the cleaned substrate. The polishing apparatus 60 may be configured to polish the thin layer and thereby to form the device isolation layer in the trench.

Hereinafter, the cleaning apparatus 40 will be described in more detail.

Figure 2:
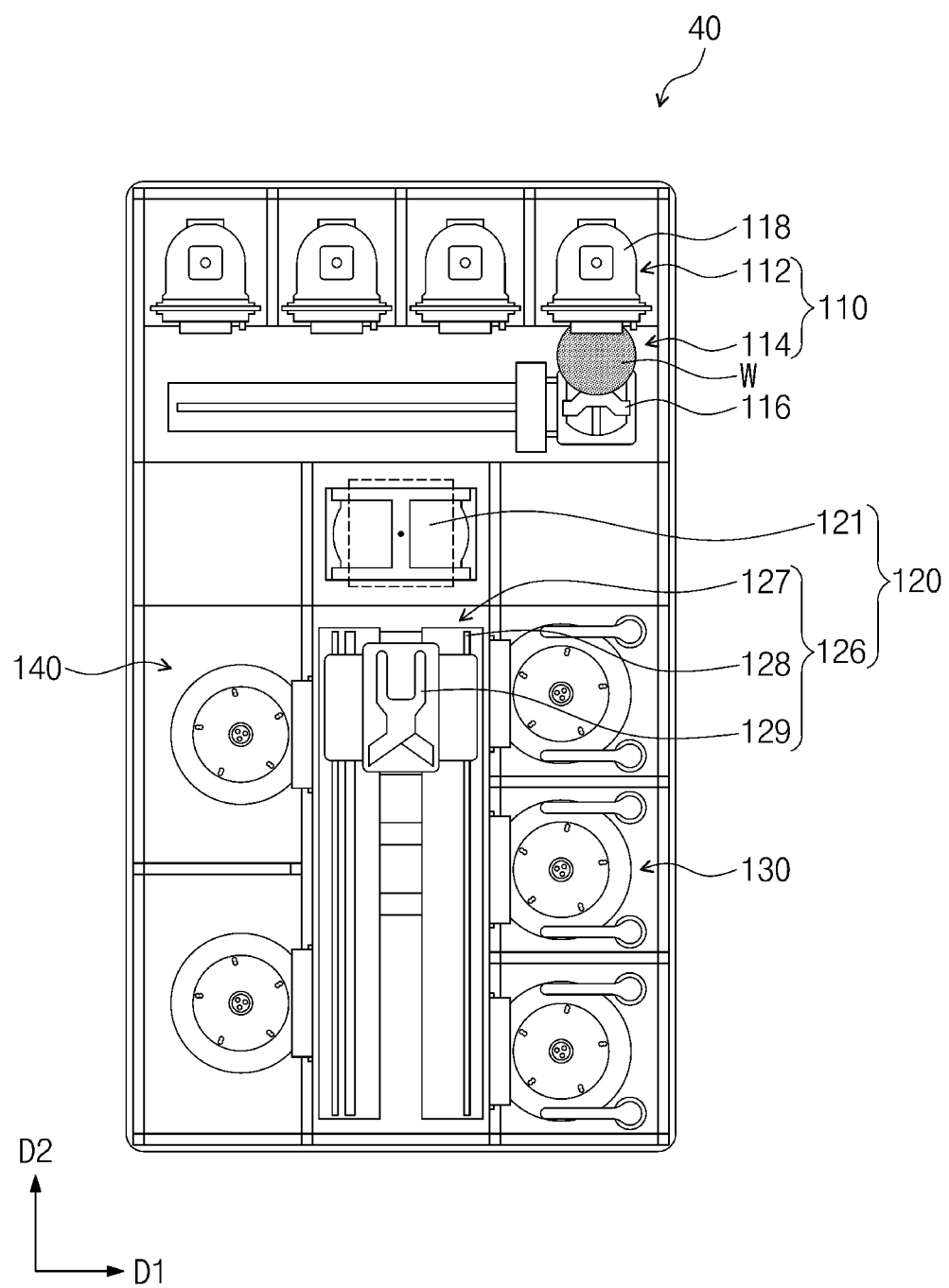
FIG. 2 is a plan view illustrating an example of a cleaning apparatus of FIG. 1.

FIG. 2 illustrates an example of the cleaning apparatus 40 of FIG. 1.

Referring to FIG. 2, the cleaning apparatus 40 may be configured to perform a cleaning process in a wet process. It will be appreciated that any wet process for cleaning semiconductor devices, substrates and/or wafers known by one of skill in the art may be used without deviating from the scope of the invention. In some embodiments, the cleaning apparatus 40 may include an index module 110, a transfer module 120, a cleaning module 130, and a dehumidification module 140.

The index module 110 may be configured to temporarily store carriers 118. Each of the carriers 118 may be configured to contain a substrate W. In some embodiments, the index module 110 may include a load port 112, a transport frame 114, and an index arm 116. The load port 112 may be configured to store the carrier 118. The carrier 118 may be a front-opening-unified-pod (FOUP) type carrier. The transport frame 114 may be provided between the load port 112 and the transfer module 120 in a first direction D1. The index arm 116 may be provided to be movable along the transport frame 114. The index arm 116 may be used to unload the substrate W from the carrier 118 and to transport the substrate W to the transfer module 120. The index arm 116 may be used to dispose the substrate W in the carrier 118, after the cleaning process on the substrate W.

The transfer module 120 may be disposed near the index module 110, the cleaning module 130, and the dehumidification module 140. The transfer module 120 may be used to transfer the substrate W from the index module 110 to the cleaning module 130 and the dehumidification module 140. In certain embodiments, the transfer module 120 may be used to transfer the substrate W from the dehumidification module 140 to the index module 110. In some embodiments, the transfer module 120 may include a buffer unit 121 and a transfer unit 126. The buffer unit 121 may be used to transfer the substrate W from the transfer unit 126 to the transport frame 114 or vice versa.

Figure 3:
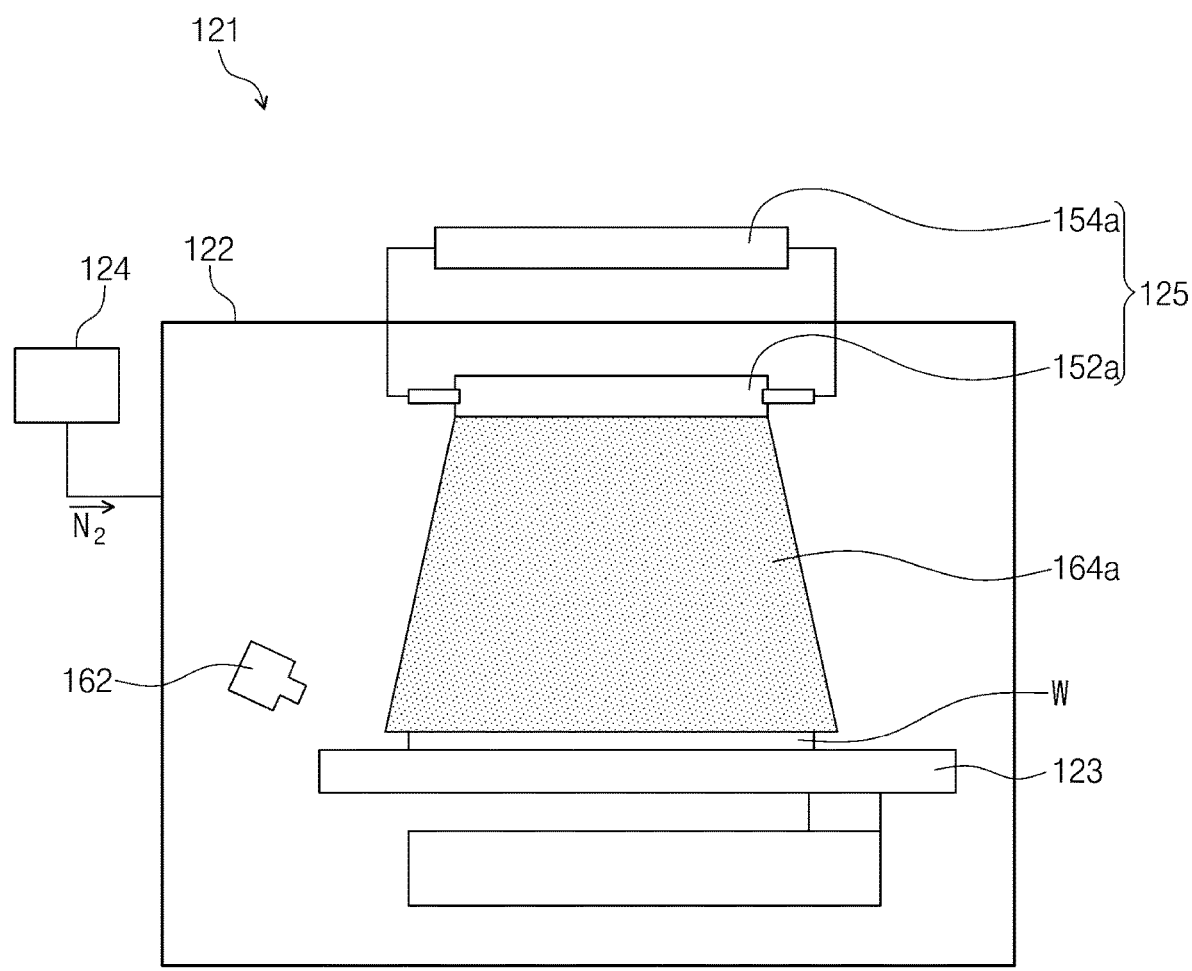
FIG. 3 is a sectional view illustrating an example of a buffer unit of FIG. 2.

FIG. 3 illustrates an example of the buffer unit 121 of FIG. 2.

Referring to FIG. 3, the buffer unit 121 may include a buffer chamber 122, a buffer arm 123, a gas supply portion 124, an annealing portion 125, and a temperature sensor 162.

The buffer chamber 122 may be provided between the transport frame 114 and the transfer unit 126. In certain embodiments, the buffer chamber 122 may be provided between the transport frame 114 and the cleaning module 130. The buffer chamber 122 may be provided between the transport frame 114 and the dehumidification module 140. In addition, the buffer chamber 122 may be provided between the cleaning module 130 and the transfer unit 126. The buffer chamber 122 may be provided between the transfer unit 126 and the dehumidification module 140. The buffer chamber 122 may be configured to provide an inner space sealed from the outside, and the substrate W may be placed in the inner space of the buffer chamber 122. The buffer chamber 122 may be connected to a vacuum pump (not shown). The buffer chamber 122 may have a pressure (e.g., about 10 Torr to about 200 Torr) that is lower than the atmospheric pressure (e.g., about 1 atm, or about 760 Torr).

The buffer arm 123 may be placed in a bottom portion of the buffer chamber 122. In the case where the substrate W is transferred into the buffer chamber 122 from the index arm 116, the substrate W may be loaded on the buffer arm 123. In certain embodiments, the substrate W to be transferred from the transfer unit 126 may be loaded on the buffer arm 123.

The gas supply portion 124 may be connected to the buffer chamber 122. The gas supply portion 124 may be configured to supply a nitrogen ($N_2$) gas into the buffer chamber 122.

The annealing portion 125 may be placed in the buffer chamber 122. The annealing portion 125 may be disposed over the buffer arm 123. The annealing portion 125 may be configured to instantly and/or temporarily heat the substrate W, which is in a standby state on the buffer arm 123. For example, the annealing portion 125 may be configured to heat the substrate W for about 1 μs to about 1 sec. In some embodiments, the annealing portion 125 may include a light source 152a and a first power supply unit 154a.

The light source 152a may be placed in the buffer chamber 122 and over the substrate W. The light source 152a may include a xenon (Xe) lamp. The light source 152a may be configured to provide light 164a to the substrate W. The light 164a may be used to instantly heat the substrate W, and this may make it possible to prevent the substrate W from being damaged. The light 164a may be used to perform a cleaning or moisture removal process on the substrate W in a dry process. For example, the light 164a may include ultraviolet light. The substrate W may be heated by the light 164a to a temperature ranging from about 100° C. to about 1200° C. (e.g., 300° C.).

The first power supply unit 154a may be connected to the light source 152a. The first power supply unit 154a may be configured to supply a pulsed power to the light source 152a.

The temperature sensor 162 may be configured to measure temperature of the substrate W. For example, the temperature sensor 162 may include a pyrometer.

Referring back to FIG. 2, the transfer unit 126 may be provided between the cleaning module 130 and the dehumidification module 140. The transfer unit 126 may be used to transfer the substrate W to the buffer arm 123, the cleaning module 130, and the dehumidification module 140. In some embodiments, the transfer unit 126 may include a transfer chamber 127, a rail 128, and a transfer arm 129.

The transfer chamber 127 may be provided between the cleaning module 130 and the dehumidification module 140. The transfer chamber 127 may be connected to the buffer chamber 122.

The rail 128 may be provided in the transfer chamber 127. The rail 128 may extend in a second direction D2.

The transfer arm 129 may be provided on the rail 128. The transfer arm 129 may be configured to be movable along the rail 128. The transfer arm 129 may be used to transfer the substrate W from one of the buffer arm 123, the cleaning module 130, the dehumidification module 140 to the other.

The cleaning module 130 may be provided at a side of the transfer chamber 127. The cleaning module 130 may be configured to perform a wet-type cleaning or moisture removal process, in which at least one of DI water, an organic solvent, or a chemical solution is used, on the substrate W.

Figure 4:
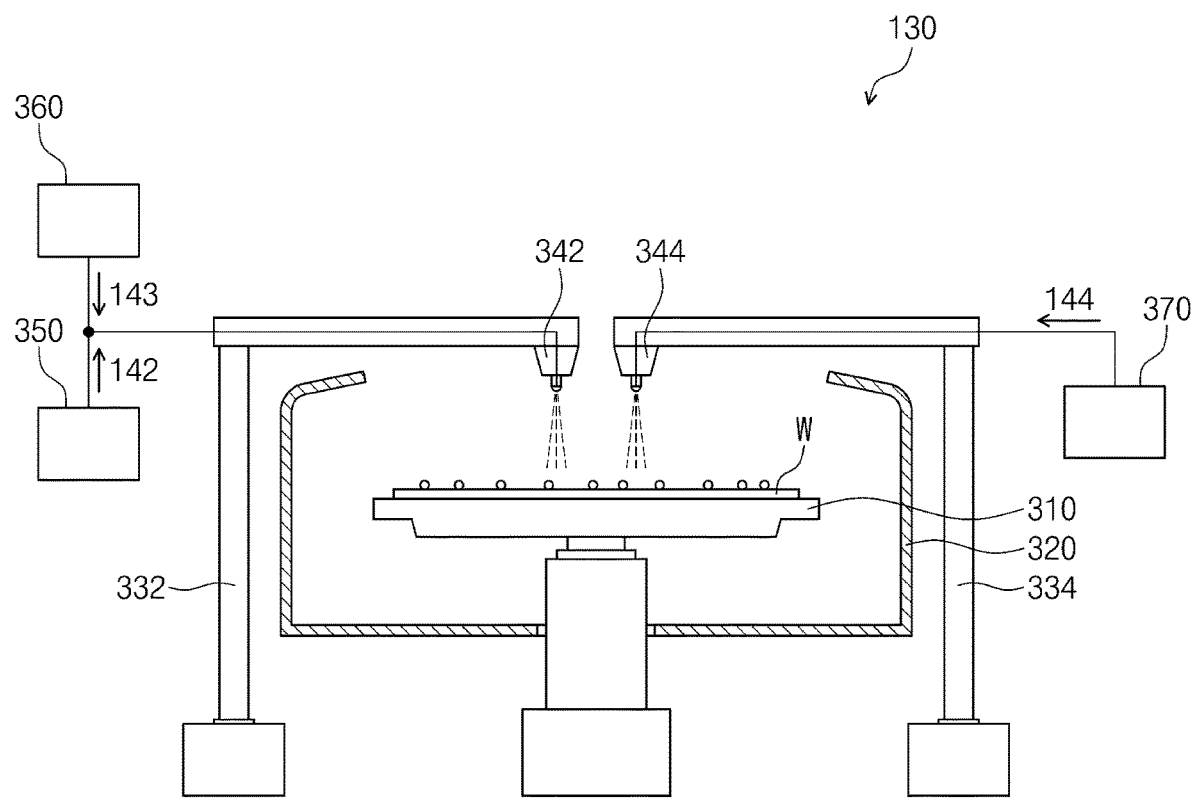
FIG. 4 is a sectional view illustrating an example of a cleaning module of FIG. 2.

FIG. 4 illustrates an example of the cleaning module 130 of FIG. 2.

Referring to FIG. 4, the cleaning module 130 may be a wet-type cleaning module. In some embodiments, the cleaning module 130 may include a first chuck 310, a bowl 320, first and second arms 332 and 334, first and second nozzles 342 and 344, a DI water supply unit 350, an organic solvent supply unit 360, and a chemical solution supply unit 370.

The first chuck 310 may be configured to load the substrate W thereon. The first chuck 310 may also be configured to rotate the substrate W. For example, the first chuck 310 may be configured to rotate the substrate W at about 10 rpm to about 6000 rpm.

The bowl 320 may be provided to surround the substrate W. The bowl 320 may be configured to prevent DI water 142, a chemical solution 144, or an organic solvent 143 on the substrate W from leaking to the outside and to prevent the substrate W from being contaminated. The DI water 142, the chemical solution 144, and the organic solvent 143 may be exhausted to the outside of the bowl 320 through a hole, which is located below the first chuck 310.

The first and second arms 332 and 334 may be configured to place the first and second nozzles 342 and 344 over the substrate W. The first nozzle 342 may be connected to a tip of the first arm 332. The second nozzle 344 may be connected to a tip of the second arm 334. The first and second arms 332 and 334 may be used to move the first and second nozzles 342 and 344 onto a center region of the substrate W.

The first and second nozzles 342 and 344 may be configured to provide each of the DI water 142, the organic solvent 143, and the chemical solution 144 onto the substrate W. For example, the first nozzle 342 may be configured to selectively provide one of the DI water 142 or the organic solvent 143 onto the substrate W. The second nozzle 344 may be configured to provide the chemical solution 144 onto the substrate W. The DI water 142, the organic solvent 143, and the chemical solution 144 may be supplied on the center region of the substrate W. The DI water 142, the organic solvent 143, and the chemical solution 144 may be used to clean the substrate W, while flowing in the outward direction from the center region of the substrate W toward an edge region.

The DI water supply unit 350 may be configured to provide the DI water 142 to the first nozzle 342. The DI water 142 may be used as cleaning solution and/or etchant. The DI water supply unit 350 may include, for example, a water filter.

The organic solvent supply unit 360 may be configured to provide the organic solvent 143 to the first nozzle 342 or the second nozzle 344. The organic solvent 143 may be used to dehumidify, i.e., remove moisture from, the substrate W in a wet process. The organic solvent 143 may contain isopropyl alcohol.

The chemical solution supply unit 370 may be configured to supply the chemical solution 144 to the second nozzle 344. The chemical solution 144 may contain cleaning solution and/or cleaning composition. For example, the chemical solution 144 may contain Standard Cleaning 1 (SC1) solution or LAL solution containing $NH_4F$ and HF.

Referring back to FIG. 2, the dehumidification module 140 may be provided at an opposite side of the transfer chamber 127 to face the cleaning module 130. The dehumidification module 140 may be configured to remove moisture from the substrate W in a dry process, for example, by removing moisture from the substrate W with a supercritical fluid.

Figure 5:
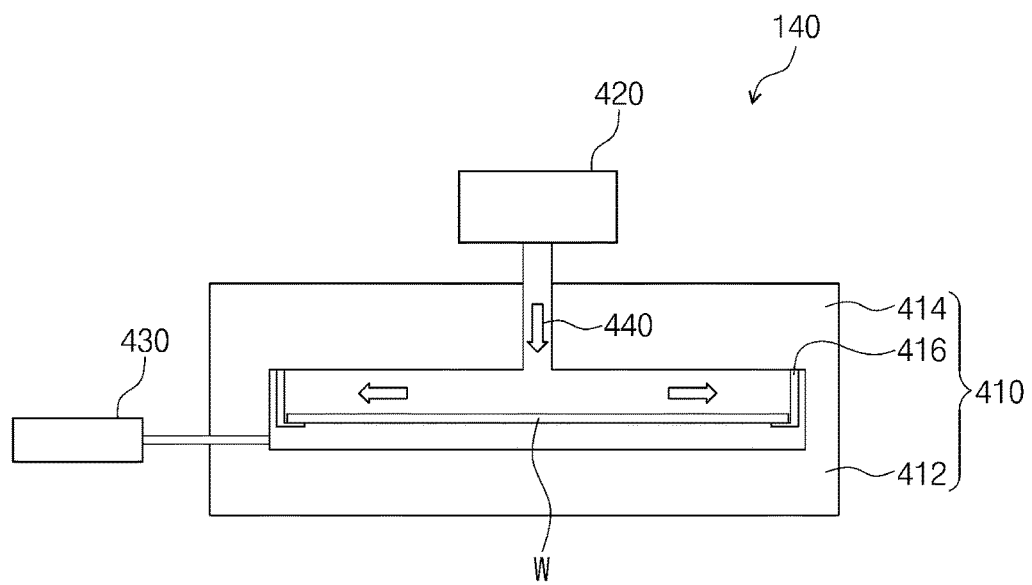
FIG. 5 is a sectional view illustrating an example of a dehumidification module of FIG. 2.

FIG. 5 illustrates an example of the dehumidification module 140 of FIG. 2.

Referring to FIG. 5, the dehumidification module 140 may be configured to perform a moisture removing process using a supercritical fluid. In some embodiments, the dehumidification module 140 may include a dehumidifying chamber 410, a supercritical fluid supply unit 420, and an exhaust unit 430.

During the moisture removal process, the dehumidifying chamber 410 may have a pressure (e.g., from about 10 atms to about 100 atms), which is higher than the atmospheric pressure (e.g., of about 1 atm, or about 760 Torr). In some embodiments, the dehumidifying chamber 410 may include a lower housing 412, an upper housing 414, and a second chuck 416. The upper housing 414 may be coupled with the lower housing 412. The second chuck 416 may be provided between the lower housing 412 and the upper housing 414. The second chuck 416 may be fastened to an inner surface of a top portion of the upper housing 414. In the case where the lower housing 412 is separated from the upper housing 414, the substrate W may be loaded on the second chuck 416.

The supercritical fluid supply unit 420 may be connected to a center portion of the upper housing 414. The supercritical fluid supply unit 420 may be used to supply supercritical fluid 440 into the dehumidifying chamber 410. The supercritical fluid 440 may be used to dissolve the organic solvent 143 on the substrate W and to dehumidify the substrate W in a dry process. During the moisture removal process, the supercritical fluid 440 may be supplied into the dehumidifying chamber 410, and in this case, the dehumidifying chamber 410 may have pressure higher than the atmospheric pressure.

The exhaust unit 430 may be configured to exhaust the supercritical fluid 440 from the dehumidifying chamber 410. In the case where the supercritical fluid 440 is used, the substrate W may be dehumidified without any stain mark of the organic solvent 143.

As will be described in more detail below, the fabrication system 10 may be used to fabricate a semiconductor device.

Figure 6:
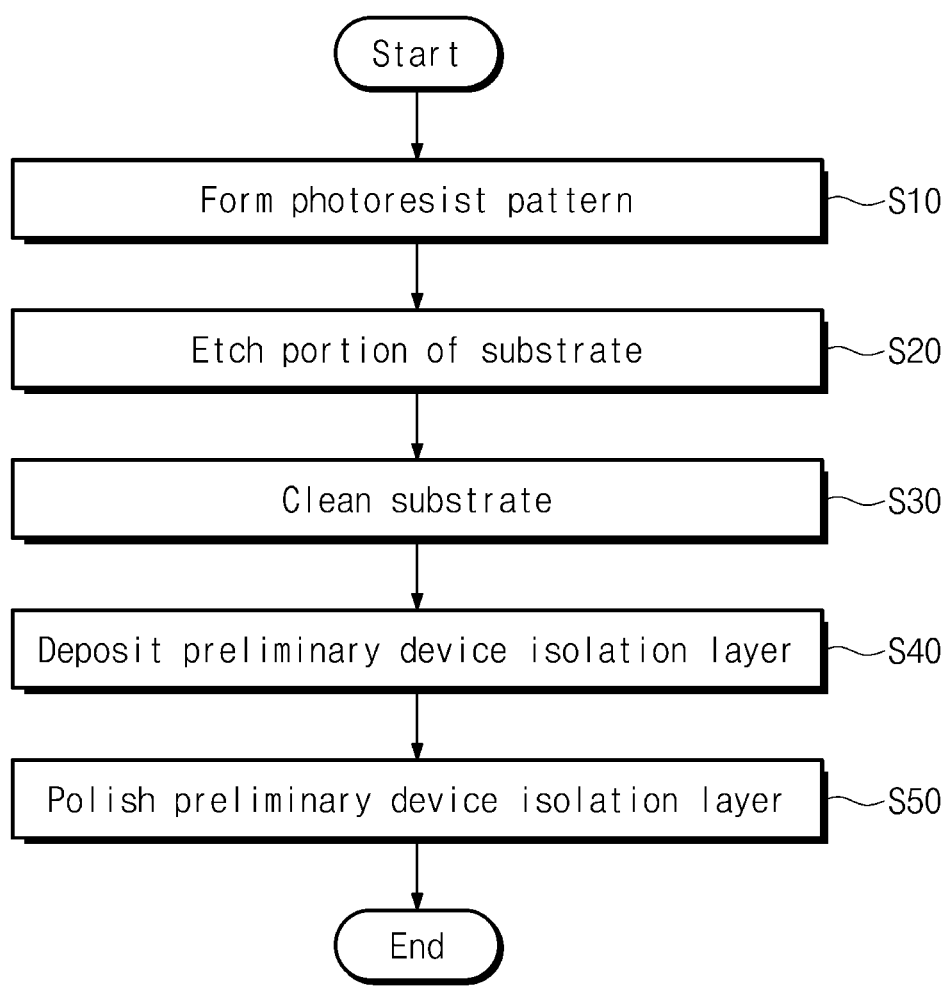
FIG. 6 is a flow chart illustrating an example of a method for fabricating a semiconductor device, according to some embodiments of the inventive concept.

FIG. 6 illustrates an example of a method for fabricating a semiconductor device, according to some embodiments of the inventive concept. FIGS. 7 to 12 are sectional views exemplarily illustrating some steps of the fabrication method of FIG. 6.

Referring to FIG. 6, a method for fabricating a semiconductor device, according to some embodiments of the inventive concept, may be used to form a device isolation layer. In some embodiments, a method for fabricating a semiconductor device may include forming the photoresist pattern on the substrate W (in S10), etching a portion of the substrate W (in S20), cleaning the substrate W (in S30), depositing a preliminary device isolation layer (in S40), and polishing the preliminary device isolation layer (in S50).

Figure 7:
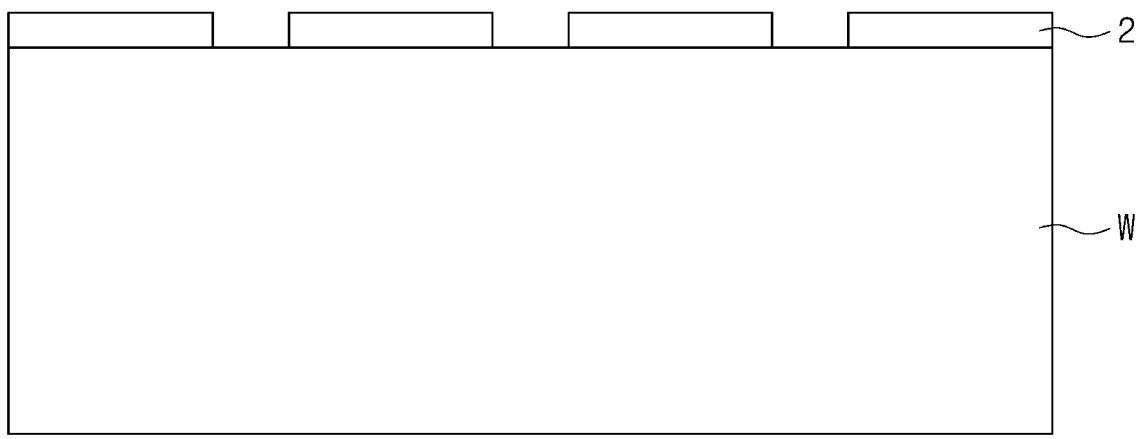
FIGS. 7 to 12 are sectional views exemplarily illustrating some steps of the fabrication method of FIG. 6.

Referring to FIGS. 6 and 7, a photoresist pattern 2 may be formed on the substrate W using the photolithography apparatus 20 (in S10). The photoresist pattern 2 may be formed through a coating process, a bake process, an exposure process, and a development process.

Figure 8:
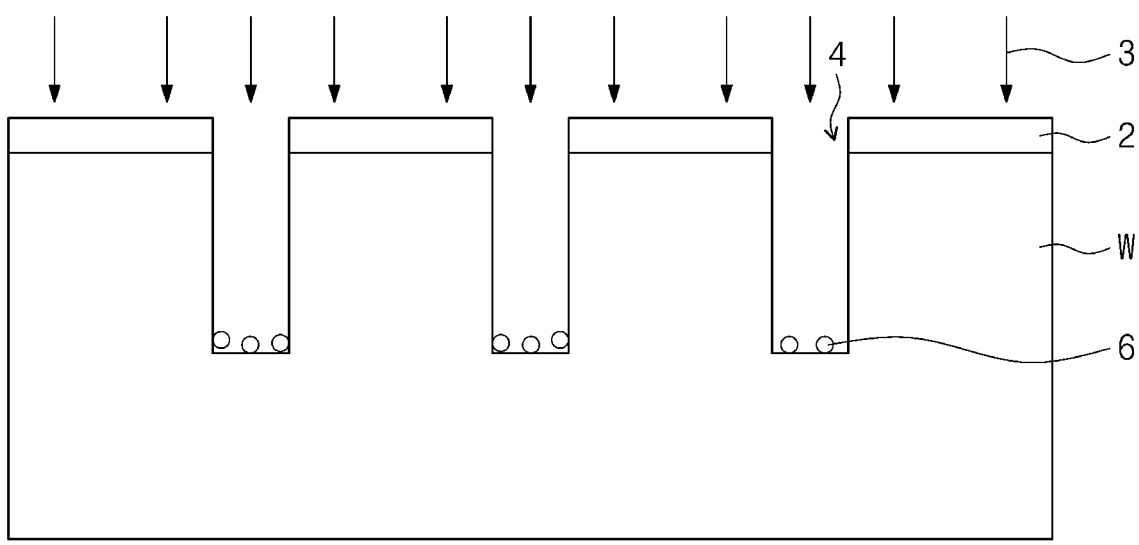

Referring to FIGS. 6 and 8, a trench 4 may be formed by etching the substrate W using the etching apparatus 30 (in S20). The trench 4 may be formed by a dry etching process using plasma 3. The plasma 3 may include ionized particles, which are produced from an inert gas or an etching gas. The substrate W may be etched by collision of the ionized particles in the plasma 3 and/or by chemical reaction with the plasma 3. During the etching process, first particles 6 may be formed on a bottom or side surface of the trench 4. The first particles 6 may be an etch residue, which is produced by the dry etching process. For example, the first particles 6 may include a polymeric material.

Figure 9:
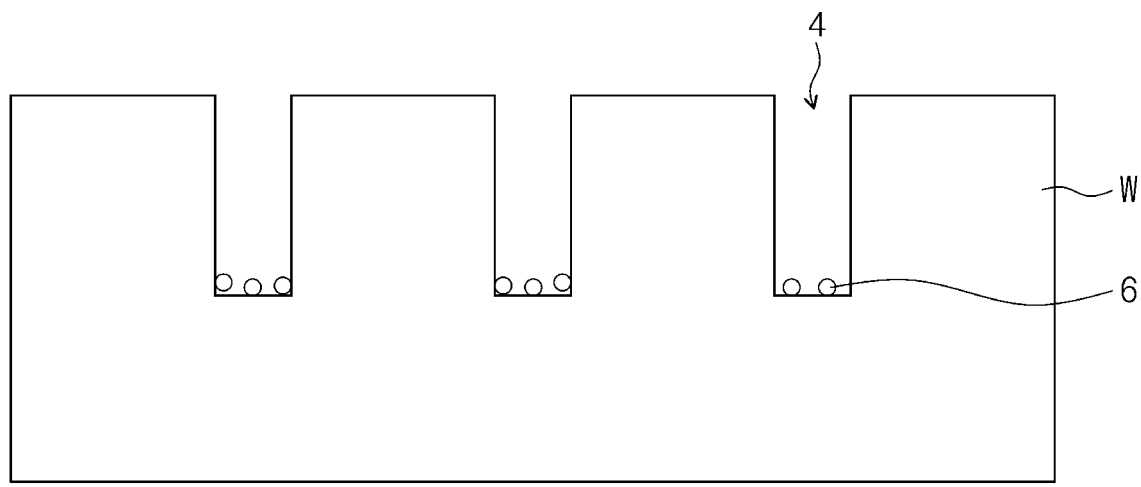

Referring to FIG. 9, the photoresist pattern 2 may be removed using an ashing apparatus (not shown). The photoresist pattern 2 may be removed by a solvent or an organic solvent (e.g., ethyl alcohol).

Figure 10:
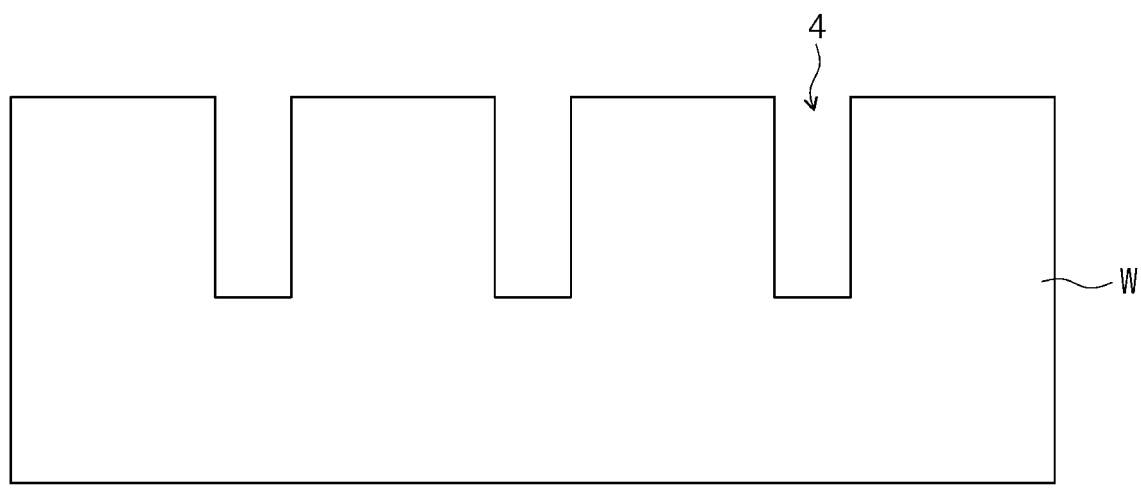

Referring to FIGS. 6 and 10, the cleaning apparatus 40 may be configured to perform a cleaning process on the substrate W and to remove the first particles 6 from the substrate W (in S30). For example, the first particles 6 may be removed by a wet cleaning method.

Figure 13:
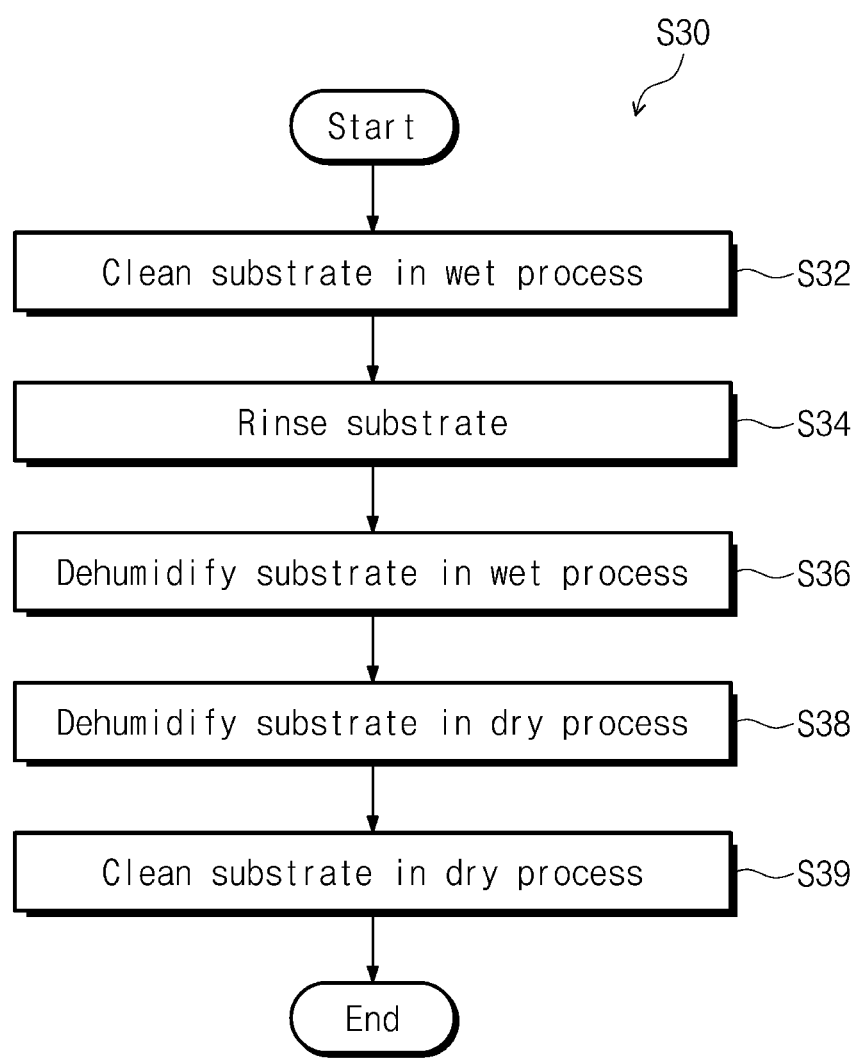
FIG. 13 is a flow chart illustrating an example of a substrate cleaning step of FIG. 6.

FIG. 13 illustrates an example of a step (e.g., S30 of FIG. 6) for cleaning the substrate W.

Referring to FIG. 13, the cleaning of the substrate W (in S30) may include cleaning the substrate W in a wet process (in S32), rinsing the substrate W (in S34), dehumidifying the substrate W in a wet process (in S36), dehumidifying the substrate W in a dry process (in S38), and cleaning the substrate W in a dry process (in S39).

Firstly, the second nozzle 344 of the cleaning module 130 may be configured to provide the chemical solution 144 onto the substrate W, and here, the chemical solution 144 may be used to clean the substrate W in a wet process (in S32). The chemical solution 144 may be used to remove the first particles 6 from the trench 4. In the case where the first chuck 310 is rotated, most of the chemical solution 144 may be removed from the substrate W. However, a part of the chemical solution 144 may remain on a top surface of the substrate W and in the trench 4.

Thereafter, the first nozzle 342 of the cleaning module 130 may be configured to provide the DI water 142 on the substrate W, and in this case, the DI water 142 may be used to rinse the substrate W (in S34). The DI water 142 may be used to partially remove the chemical solution 144 remaining on the substrate W. In the case where the first chuck 310 is rotated, most of the DI water 142 may be removed from the top surface of the substrate W. The DI water 142 may remain on the top surface of the substrate W and in the trench 4.

Next, the first nozzle 342 or the second nozzle 344 of the cleaning module 130 may be configured to provide the organic solvent 143 on the substrate W, and the organic solvent 143 may be used to dehumidify the substrate W in a wet process (in S36). The organic solvent 143 may be used to remove the DI water 142 from the substrate W. The organic solvent 143 may remain on the top surface of the substrate W and in the trench 4.

Thereafter, the transfer arm 129 may be configured to transfer the substrate W from the cleaning module 130 to the dehumidification module 140.

Next, the dehumidification module 140 may be configured to provide the supercritical fluid 440 onto the substrate W and to dehumidify the substrate W in a dry process (in S38). The substrate W may be dehumidified in a dry process by the supercritical fluid 440.

Thereafter, the transfer arm 129 may be configured to dispose the dehumidified substrate W on the buffer arm 123.

Figure 14:
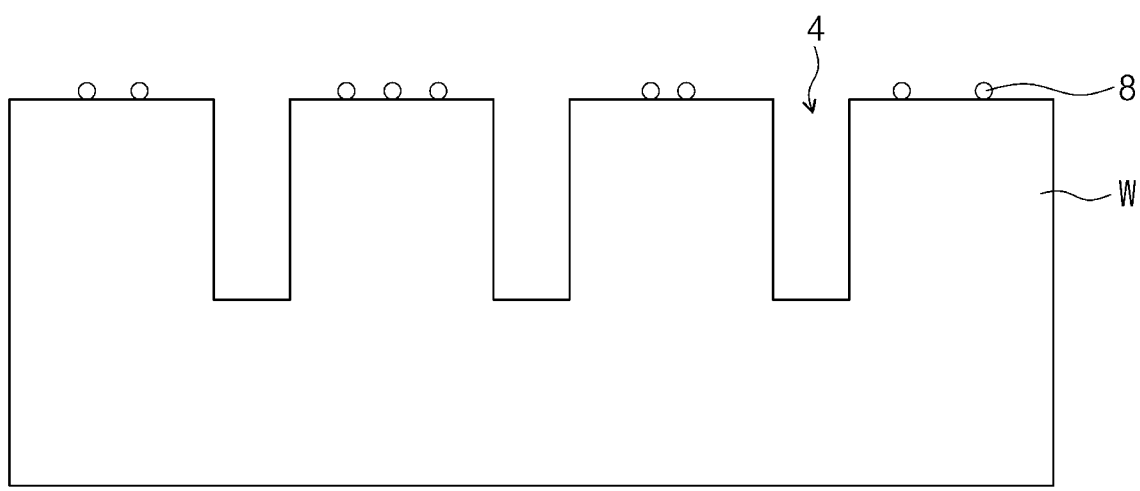
FIG. 14 is a sectional view illustrating second particles formed on a substrate by supercritical fluid of FIG. 5.

FIG. 14 illustrates second particles 8, which are formed on the substrate W by the supercritical fluid 440 of FIG. 5.

Referring to FIG. 14, in the case where the supercritical fluid 440 is used, a second particles 8 may be formed on the top surface of the substrate W between the trenches 4. The second particles 8, which is formed by the use of the supercritical fluid 440, may be defect particles. For example, the second particles 8 may be a granular material which is formed by agglomeration of carbon dioxide and isopropyl alcohol (e.g., $CO_2+2C_3H_8O$). The second particles 8 may include hydrocarbon particles.

Referring back to FIG. 11, the annealing portion 125 may be configured to perform a dry cleaning process on the substrate W (i.e., to remove the second particles 8 from the substrate W in a dry process) (in S39). The use of light 164a may allow the substrate W to be cleaned in a dry process, without any damage of the substrate W. In the case where the light 164a is used, the second particles 8 may be removed in a thermolysis and/or photolysis manner. For example, in the case where the second particles 8 is a granular material formed by the agglomeration of carbon dioxide and isopropyl alcohol (e.g., $CO_2+2C_3H_8O$), the light 164a may be used to decompose the second particles 8 into carbon dioxide gas ($CO_2$), carbon monoxide gas (e.g., $2CO$), and methane gas ($4CH_4$) in a thermolysis and/or photolysis manner. In certain embodiments, the light 164a may be used to sublimate the second particles 8. In the case where the second particles 8 are a solid hydrocarbon particles, the second particles 8 may be sublimated by the light 164a, thereby forming a hydrocarbon gas. The light 164a may have an energy that is lower than that of the plasma 3. Photons of the light 164a may be used to instantly heat the substrate W and the second particles 8 for about 1 μs to about 1 sec. The carbon dioxide gas, the carbon monoxide gas, the methane gas, and/or the hydrocarbon gas, along with a dilute gas, such as the $N_2$ gas, may be exhausted to the outside of the buffer chamber 122. In addition, the annealing portion 125 may be used to perform a cleaning process on the substrate W in a dry process, before solidification or adhesion of the second particles 8. If the substrate W is not cleaned in a dry process and then is exposed to the air, an oxide layer or a natural oxide layer may be formed on the substrate W. If the oxide layer or the natural oxide is formed, the second particles 8 may be solidified on the substrate W. According to some embodiments of the inventive concept, the second particles 8 on the substrate W may be removed by the annealing portion 125, before the substrate W is exposed to the air.

Referring to FIG. 2, the index arm 116 may be used to dispose the substrate W in the carrier 118. The carrier 118 may be provided in the deposition apparatus 50.

Figure 11:
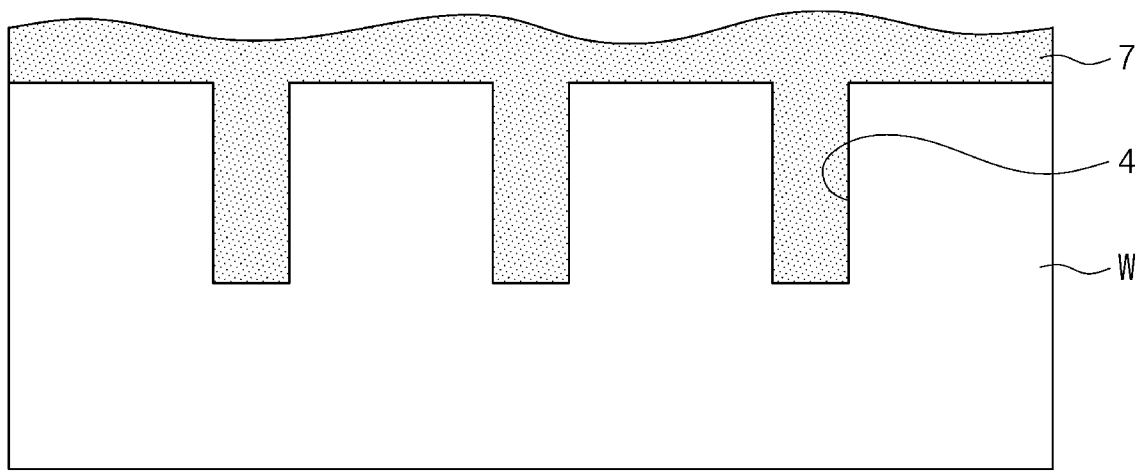

Referring to FIG. 11, the deposition apparatus 50 may be configured to deposit a preliminary device isolation layer 7 on the substrate W (in S40). The preliminary device isolation layer 7 may include a silicon oxide layer, which is deposited by a plasma-enhanced chemical vapor deposition (PECVD) method. The preliminary device isolation layer 7 may be formed to fill the trench 4. The substrate W may be disposed in the carrier 118 and then may be transferred to the polishing apparatus 60.

Although not shown, a protection layer may be formed between the substrate W and the preliminary device isolation layer 7. The protection layer may include a poly silicon layer formed by a chemical vapor deposition method. The protection layer may be formed to a thickness of about 10 nm to about 100 nm.

Figure 12:
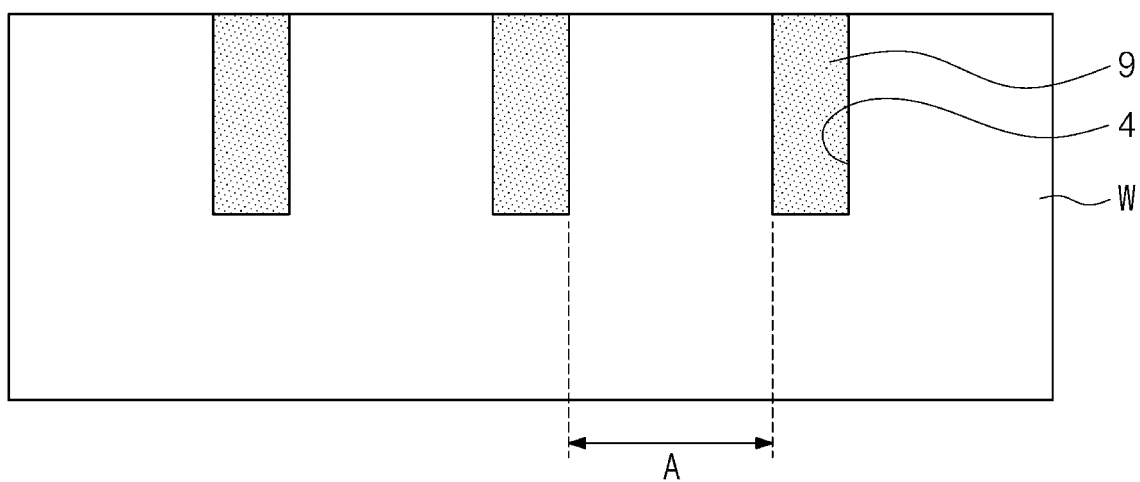

Referring to FIG. 12, the preliminary device isolation layer 7 may be polished using the polishing apparatus 60 to expose the substrate W and to form the device isolation layer 9 (in S50). The device isolation layer 9 may be formed in the trench 4. The device isolation layer 9 may define an active region A. The active region A may be a region of the substrate W, on which semiconductor devices will be formed, and which is delimited by the device isolation layer 9. Although not shown, the afore-described fabrication apparatus and method may be used to form other device (e.g., a capacitor).

Figure 15:
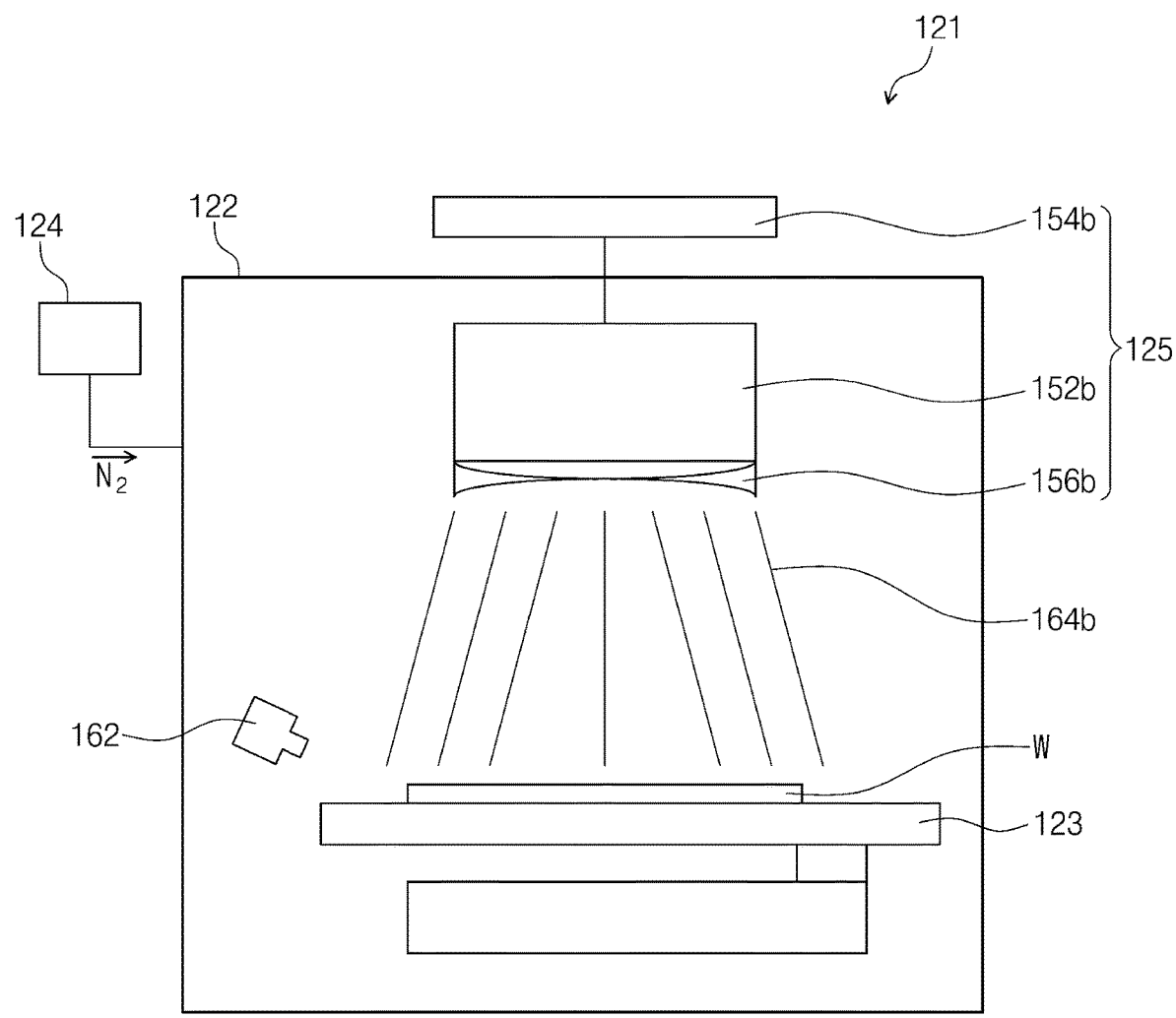
FIG. 15 is a sectional view illustrating an example of a buffer unit of FIG. 2.

FIG. 15 illustrates an example of the buffer unit 121 of FIG. 2.

Referring to FIG. 15, the annealing portion 125 of the buffer unit 121 may be or include a laser device. The buffer chamber 122, the buffer arm 123, the gas supply portion 124, and the temperature sensor 162 may be configured in substantially the same manner as those of FIG. 3. In some embodiments, the annealing portion 125 may include a laser source 152b, a second power supply unit 154b, and an objective lens 156b.

The laser source 152b may be provided in the buffer chamber 122 and over the substrate W. The laser source 152b may be configured to generate laser light 164b.

The second power supply unit 154b may be connected to the laser source 152b. The second power supply unit 154b may be configured to supply electric power to the laser source 152b.

The objective lens 156b may be provided between the laser source 152b and the buffer arm 123. The objective lens 156b may enlarge and project the laser light 164b so that the laser light 164b is incident onto the substrate W. The use of the laser light 164b may allow the substrate W to be cleaned in a dry process, without any damage of the substrate W. The laser light 164b may have an energy that is lower than that of plasma 3. Photons of the laser light 164b may be used to heat the substrate W and the second particles 8. If the substrate W is irradiated with the laser light 164b, the substrate W may be heated. The second particles 8 may be removed from the substrate W using a thermal decomposition method and/or a vaporization method.

Figure 16:
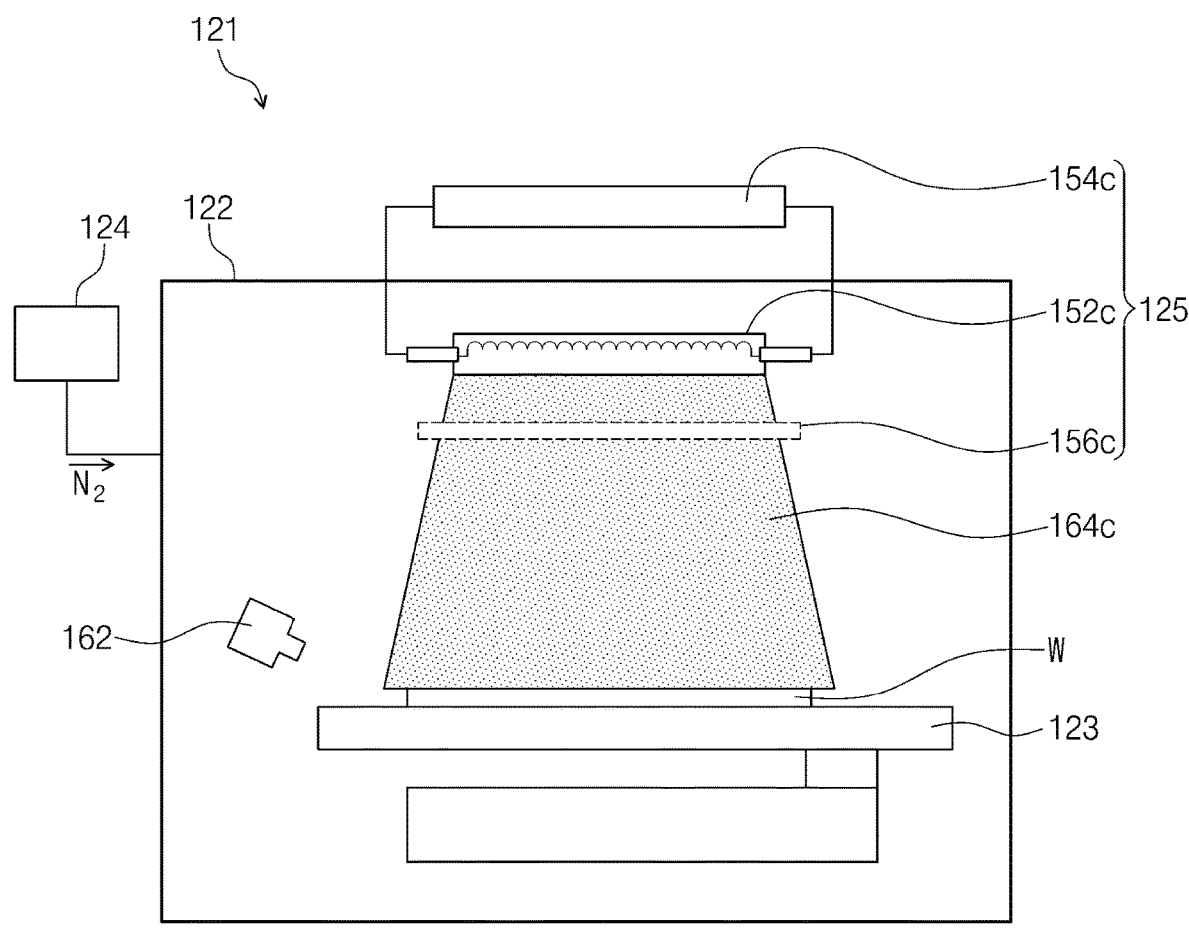
FIG. 16 is a sectional view illustrating an example of a buffer unit of FIG. 2.

FIG. 16 illustrates an example of the buffer unit 121 of FIG. 2.

Referring to FIG. 16, the annealing portion 125 of the buffer unit 121 may be an apparatus, which is configured to heat a target object (e.g., the substrate W) using infrared light or to perform a rapid thermal treatment process on the target object. The buffer chamber 122, the buffer arm 123, the gas supply portion 124, and the temperature sensor 162 may be configured in substantially the same manner as those of FIG. 3. In some embodiments, the annealing portion 125 may include an incandescent light source 152c, a third power supply unit 154c, and a filter 156c.

The incandescent light source 152c may be provided in the buffer chamber 122 and over the substrate W. The incandescent light source 152c may be configured to generate infrared light 164c or visible light. For example, the incandescent light source 152c may include a halogen lamp or an incandescent lamp.

The third power supply unit 154c may be connected to the incandescent light source 152c. The third power supply unit 154c may be configured to supply electric power to the incandescent light source 152c.

The filter 156c may be provided between the incandescent light source 152c and the buffer arm 123. The filter 156c may be configured to perform a filtering operation on light emitted from the incandescent light source 152c or to remove the ultraviolet light from the emitted light.

The use of infrared light 164c or visible light may allow the substrate W to be cleaned in a dry process, without any damage of the substrate W. The infrared light 164c or visible light may have an energy that is lower than that of the plasma 3. In the case where the infrared light 164c or visible light is provided onto the substrate W, the substrate W may be cleaned in a dry process. That is, if the substrate W is heated by the infrared light 164c or visible light, the second particles 8 may be removed using a thermal decomposition method and/or a vaporization method.

In a substrate cleaning method according to some embodiments of the inventive concept, light, whose energy is lower than that of plasma, is used to clean a substrate in a dry process. For example, the light may be used to remove defect particles, which are produced on the substrate by a supercritical fluid, without damage of the substrate.

While example embodiments of the inventive concept have been particularly shown and described, it will be understood by one of ordinary skill in the art that variations in form and detail may be made therein without departing from the spirit and scope of the attached claims.

What is claimed is:

1. A method for cleaning a substrate comprising:
providing a carrier storing a substrate into an index chamber;
unloading the substrate using a buffer arm in buffer chamber connected to the index chamber in a first direction to provide the substrate into a transfer chamber connected to the buffer chamber in the first direction;
transferring the substrate into a cleaning chamber connected to the transfer chamber in a second direction by a transfer arm in the transfer chamber to clean the substrate using a chemical solution;
transferring the substrate into a dry chamber connected to the transfer chamber facing the cleaning chamber in the second direction intersecting the first direction to remove moisture from the substrate using a supercritical fluid; providing the substrate on the buffer arm in the buffer chamber using the transfer arm;
illuminating a light onto the substrate using a lamp disposed above the buffer arm in the buffer chamber to remove defect particles, produced by the supercritical fluid in the dry chamber; and
reloading the substrate into the carrier.

2. The method of claim 1, wherein the defect particles comprise hydrocarbon particles and the defect particles are removed from the substrate by a heat of the light.

3. The method of claim 1, wherein the light comprises ultraviolet light.

4. The method of claim 1, wherein the light includes a laser light.

5. The method of claim 1, wherein the light includes an infrared or visible light.

6. The method of claim 1, wherein the substrate is cleaned by the chemical solution onto the substrate in the cleaning chamber, and
the substrate is rinsed by deionized (DI) water onto the substrate to remove the chemical solution in the cleaning chamber.

7. The method of claim 6, wherein the substrate is dried by an organic solvent onto the substrate to remove the DI water.

8. A method for fabricating a semiconductor device, comprising:
etching a substrate by an etcher to form trenches;
storing the substrate in a carrier;
providing the carrier into an index chamber;
unloading the substrate using a buffer arm in buffer chamber connected to the index chamber in a first direction to provide the substrate into a transfer chamber connected to the buffer chamber in the first direction;
transferring the substrate into a cleaning chamber connected to the transfer chamber in a second direction intersecting the first direction by a transfer arm in the transfer chamber to clean the substrate using a chemical solution;

transferring the substrate into a dry chamber connected to the transfer chamber facing the cleaning chamber in the second direction to remove moisture from the substrate using a supercritical fluid; illuminating a light onto the substrate using a lamp disposed above the buffer arm in the buffer chamber to remove defect particles produced by the supercritical fluid in the dry chamber; and reloading the substrate into the carrier.

9. The method of claim 8, further comprising forming a photoresist pattern on the substrate by a lithography apparatus, wherein etching the substrate comprises etching a portion of the substrate, exposed by the photoresist pattern, using plasma.

10. The method of claim 9, wherein the light having an energy lower than that of the plasma.

11. The method of claim 8, wherein the light includes a laser light.

12. The method of claim 8, wherein the light includes an infrared or visible light.

13. The method of claim 8, further comprising forming a device isolation layer in the trenches.

* * * * *